(12) United States Patent
Harrenstien et al.

(10) Patent No.: US 8,539,943 B2
(45) Date of Patent: Sep. 24, 2013

(54) METHOD FOR SUPPORTING A STRETCHED MEMBRANE SOLAR TROUGH COLLECTOR

(76) Inventors: Howard P. Harrenstien, Miami, FL (US); Allen I. Bronstein, Inverness, CA (US)

( * ) Notice: Subject to any disclaimer, the term of this patent is extended or adjusted under 35 U.S.C. 154(b) by 613 days.

(21) Appl. No.: 12/423,784

(22) Filed: Apr. 14, 2009

(65) Prior Publication Data
US 2010/0258186 A1  Oct. 14, 2010

(51) Int. Cl.
*F24J 2/10* (2006.01)
(52) U.S. Cl.
USPC .......................................... 126/696; 126/692

(58) Field of Classification Search
USPC ......... 126/569, 683–697, 704; 359/846–849, 359/871–876
See application file for complete search history.

(56) References Cited

U.S. PATENT DOCUMENTS

| | | | |
|---|---|---|---|
| 4,328,789 A | 5/1982 | Nelson | |
| 4,528,977 A | 7/1985 | Malley | |
| 5,071,243 A | 12/1991 | Bronstein | |
| 2007/0240704 A1* | 10/2007 | Prueitt | 126/600 |
| 2008/0247069 A1 | 10/2008 | Bronstein | |

* cited by examiner

*Primary Examiner* — Jennifer L. Doak
(74) *Attorney, Agent, or Firm* — Jill L. Robinson

(57) ABSTRACT

An improved solar reflector with a frame structure suitable for spanning longer distances that utilizes light-weight side beams, ridgecaps and tensioned cables to form a truss-system.

14 Claims, 17 Drawing Sheets

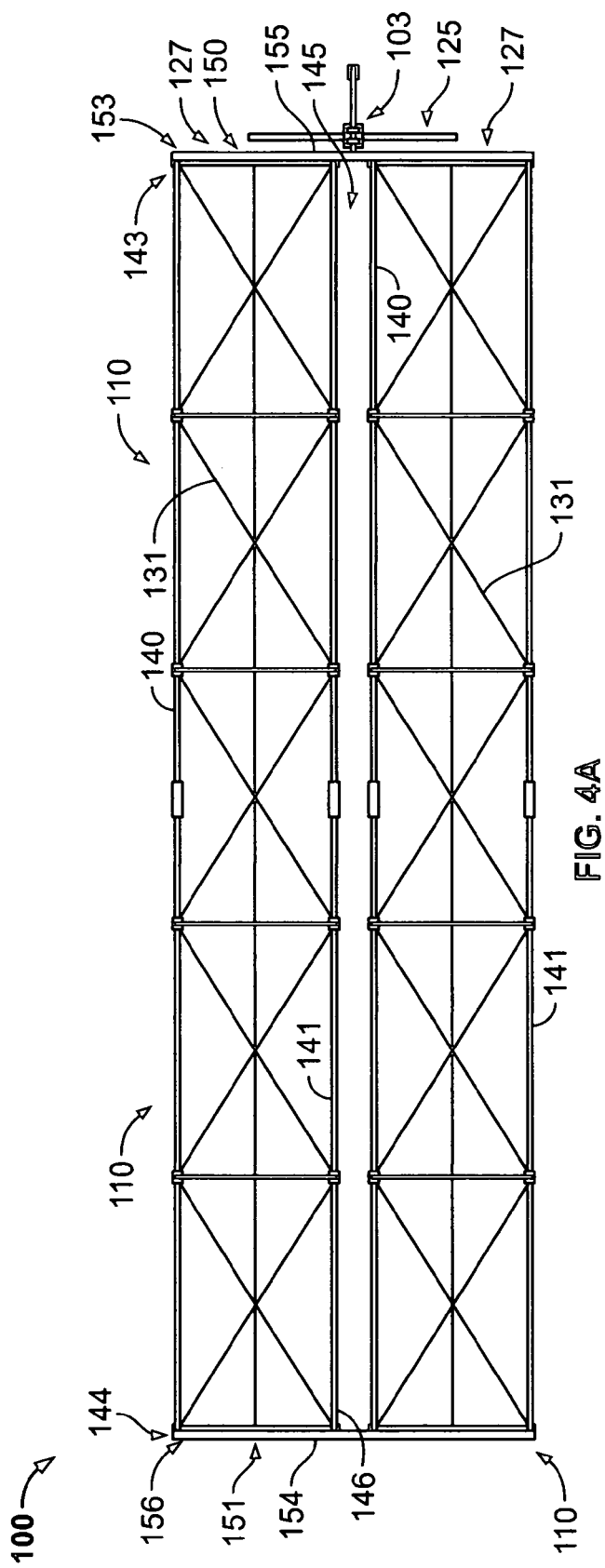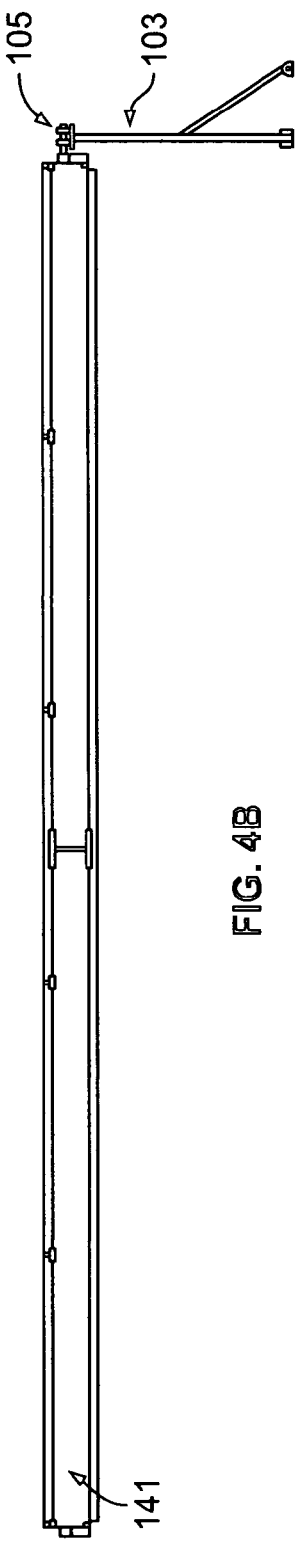
FIG. 4A
FIG. 4B

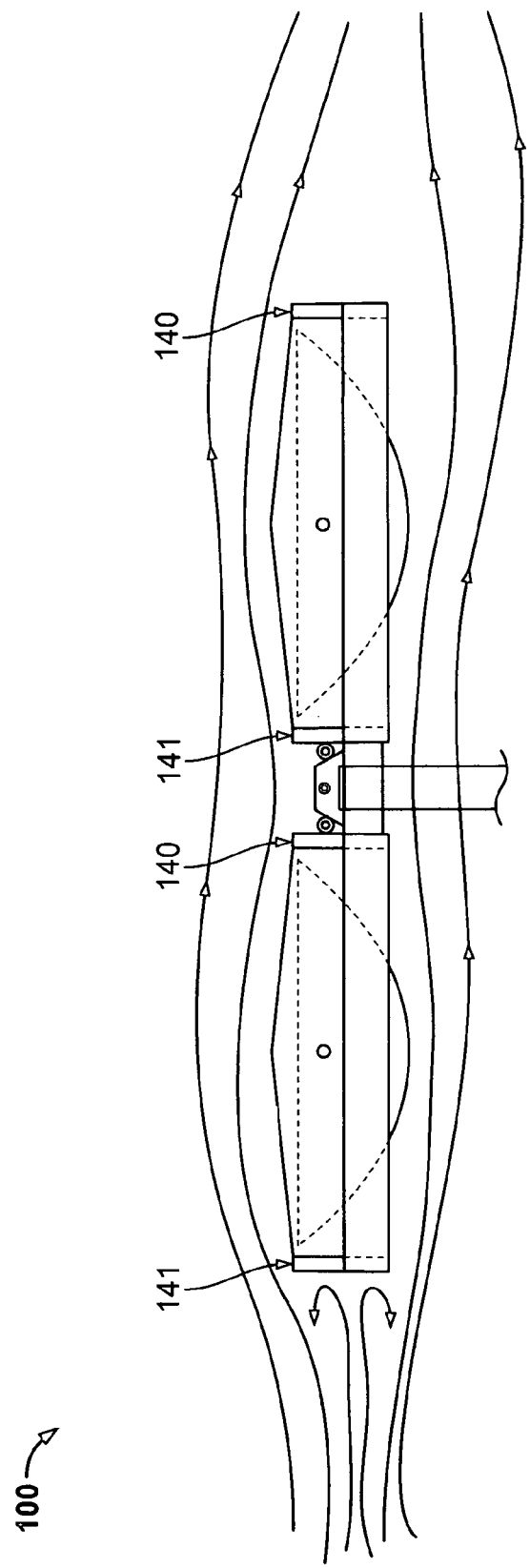

METHOD FOR SUPPORTING A STRETCHED MEMBRANE SOLAR TROUGH COLLECTOR

BACKGROUND OF THE INVENTION

The invention relates to a solar collector in the nature of an arcuate generally parabolic surface which concentrates solar radiation upon an energy absorbing target which is located at the focus of the parabola.

Linear tensioned thin-film, or "membrane" concentrators have many advantages over more traditional designs utilizing rigid backed reflective material. Most importantly they weigh less. The reduced weight allows larger collectors to be mounted on a pair of posts with a specified strength and roofs with a given specified load. In addition, multiple concentrators can be controlled for example rotated, with less energy due to the lower weight. Thus, fewer motors may be required to move them into a desired position.

Linearly tensioned thin-film concentrators are typically supported at each end. The length of the span between supports is one of the most important factors of weight and cost, since the end supports are among the heaviest and most expensive components of the system. Typical systems use a single beam or steel tube to span the length. This approach has three major limitations.

First, the torsional rigidity of a tube varies inversely with the length, i.e. a forty foot tube has ½ the torsional rigidity of a twenty foot tube (assuming other factors are fixed). This makes it very difficult to use a torsion tube to span large distances and thus reduce the cost of a linearly tensioned thin-film concentrator.

Second, the buckling strength of a long torsion tube is generally low and inversely proportional to the square of the length. Since the tube is generally in a horizontal position, it must resist the effect of buckling while it is resisting its own weight as a beam. In addition, linearly tensioned thin-film reflectors place the tube in compression, which significantly increases the buckling forces on the torsion tube. While the buckling strength will increase with fixed ends, it is still of major concern. In order for a single tube to meet the required strength over a long span, the thickness of material and the diameter of the tube used must be increased. The increased weight and cost of a tube to span a long distance often makes it impractical for use in spanning long distances.

Third, using a long torsion tube in the center of a collector pair makes it difficult to attach additional components on the outside edges of the collector pair. One specific limitation this causes is a difficulty to securely attach wind spoilers to deflect wind at the edges of the collectors. Deflecting wind at the outer horizontal edges is critical for collectors that are stowed in the horizontal position.

BRIEF SUMMARY OF THE INVENTION

The present invention relates to improvements in the support structure or "frame," of a linearly tensioned thin-film solar collector or concentrator that significantly increases the length that the reflective thin-film membrane may span. A longer span allows for a reduced number of support posts, thereby decreasing the cost and enabling the frame to be custom fitted to a supporting roof structure. Additional features decrease wind-related forces making the current device especially well-suited to roof-top installations. Further, a frame structure allows for the replacement of the thin-film membrane without replacement of the entire trough unit.

The invention provides for a novel truss system comprising of side-beams, ridge-caps, tensioned cables, tension arms or end beams, and posts. The side beams can be configured to deflect wind, and in combination with a convex cover for the collector, significantly increase the wind resistance over other designs.

The novel truss system utilizes light-weight side-beams with appropriate torsional and bending strength and appropriate rigidity to increase the span. The side-beams are supported at their ends with a tension arm. The side-beams may be formed in sections and spliced together to form longer sections. Each end of the thin-film reflector is strapped or otherwise attached to an end-form whose periphery has the desired reflector shape. The end-forms are connected to the "end beams" of the frame with large threaded rods and biasing springs. These "end beams" may be a separate members or preferably, integral with the tension arm structure, or alternatively, a region on longer beams. As the bolt on the threaded rod is tightened, the end-forms are pulled closer to the end beam portion of the tension arms and away from each other and the tensioned thin-film reflector is stretched into the correct shape. This tightening pulls on the tension arms and places the side-beams in compression.

Ridge-caps are placed across the collector preferably at a fixed spacing. End ridge caps are placed over the end forms. Cables connect opposite corners diagonally, where the ridge-caps and end ridge-caps are connected to the side-beams. The ridge-caps end ridge-caps and cables form a truss system in conjunction with the side-beams. This provides a very strong, light-weight structure that may be used over a long span and has increased resistance to wind and earthquakes.

Shaping forms, or ribs, that aid the linear tensioned thin-film reflector in keeping the desired shape may be placed along the reflector, preferably under the ridge-caps. The ridge caps may also support a ridge pole or poles for supporting a tensioned thin-film cover with a convex profile, which, in combination with the side beams and the curved lower surface of the tensioned thin-film reflective membrane reduces the wind forces on the reflector and thus on any roof structure on which the device is installed.

The length of the support structure may be varied to customize it for specific installations. For example, beams in commercial buildings may have custom spacing or the angle of the collectors on the rooftop could require custom lengths. While the side beams could simply be manufactured to the desired length for the particular installation, it is also possible to construct telescoping beams that allow for varied lengths.

BRIEF DESCRIPTION OF THE SEVERAL VIEWS OF DRAWINGS

FIG. 1 shows a perspective view of the frame.
FIG. 2 shows a perspective view of one end of the frame.
FIG. 3 shows an end view of two frames supported by a post and piston dampers.
FIG. 4A shows a top view of the frame.
FIG. 4B shows a side view of the frame.
FIG. 5 shows the detail of the attachment of the tension arm to the side beam.
FIG. 6 shows the detail of the attachment of the end form to the tension arm.
FIG. 7 shows the attachment of the cables to the frame.
FIG. 8 shows a perspective view of the middle of the frame.
FIG. 9 shows a perspective view of the cover for the device.
FIG. 10 shows a detail of the cover.
FIG. 11 shows the effect of wind on the device.
FIG. 12A shows perspective view of a light-weight beam construction employing closed sections.

DETAILED DESCRIPTION OF THE INVENTION

Figure 1:
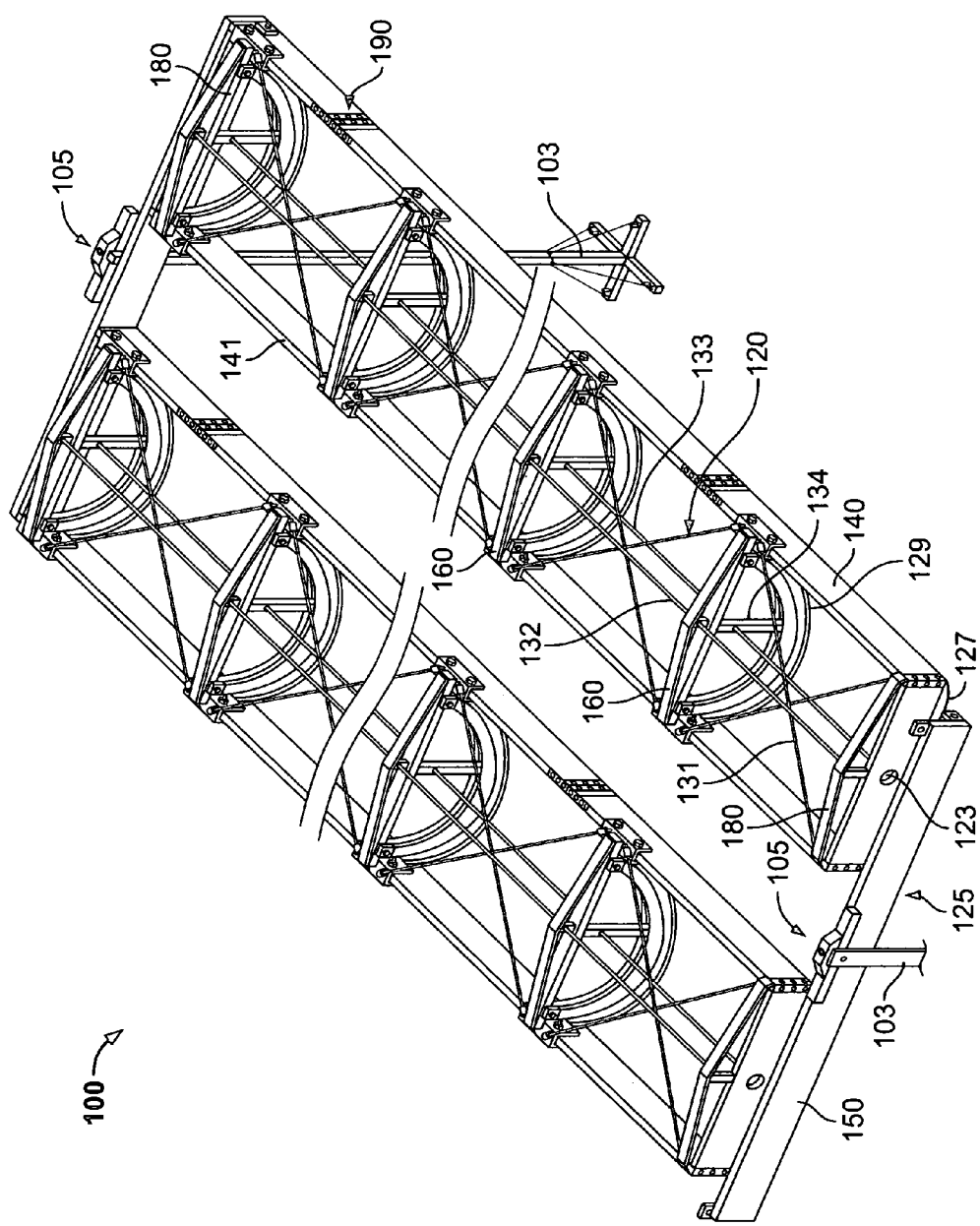
Figure 2:
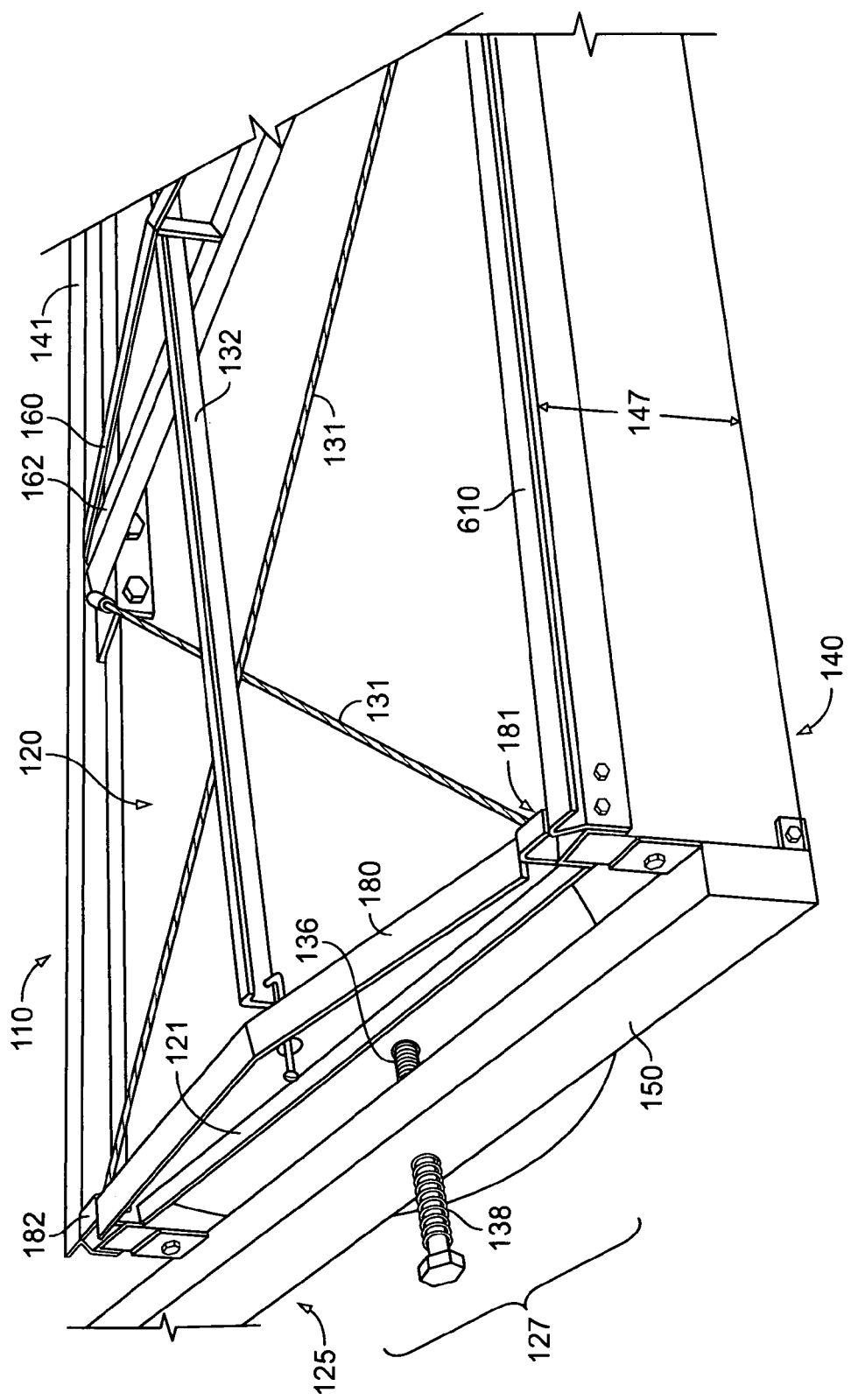

With reference to FIGS. 1-4 the solar collector 100 device includes a support means for supporting one or more frames 110, which can be a braced post 103 or other appropriate structure.

The frame 110 or frames is supported by a tension arm assembly 125 that may include extensions 127. The tension arm assembly 125 is rotably attached 105 to the post 103 so as to allow the frames 110 to be moved under the control of a control system (not shown) so as to maintain optimal position with respect to the sun and to avoid damage from high winds, as further described below. Multiple frames may be supported on a single tension arm assembly 125, and would be balanced so as to allow for ease of rotation. Alternatively, each frame could be supported rotably on the tension arm or other support structure individually.

The frames include two light-weight side beams 140, 141, each defining a first end 143, 145 and a second end 144, 146. The frame 110 also includes two end beams 150, 151. Each end beam 150, 151 also defines a first end 153, 155 and a second end 154, 156. These "end beams" are preferably integral with the tension arm extensions 127, i.e., the function of the end beams is performed by the tension arm assembly extensions 127, although a separate end beam member attached to the tension arm assembly 125, could be used. Further, it will be understood that the "end beams" can be a region on a longer beam, or tension arm, with the "end" of the beam defined as a particular point on the longer beam. It is also possible that the ends of the side beams could similarly be a region on a longer beam.

The first ends of the first side 143 and first end beams 153 are attached together by bolting or other appropriate means. Similarly the second ends of the second side 146 and first end beams 154 are attached together, the second ends of the first side beam 144 and the second end beam 156 are attached; and the first end of second side beam 145 and the second end beam 155 are attached. In the embodiment shown, the beams are straight and thus attached to form a substantially rectangular structure. It is possible, however that the beams could have a shape other than straight, provided that they could be attached to form a frame with appropriate characteristics. An acceptable alternative would be to replace the beams with an appropriately designed space frame, with integrated wind spoilers, that has adequate axial load, bending, and torsional resistance.

Figure 5:
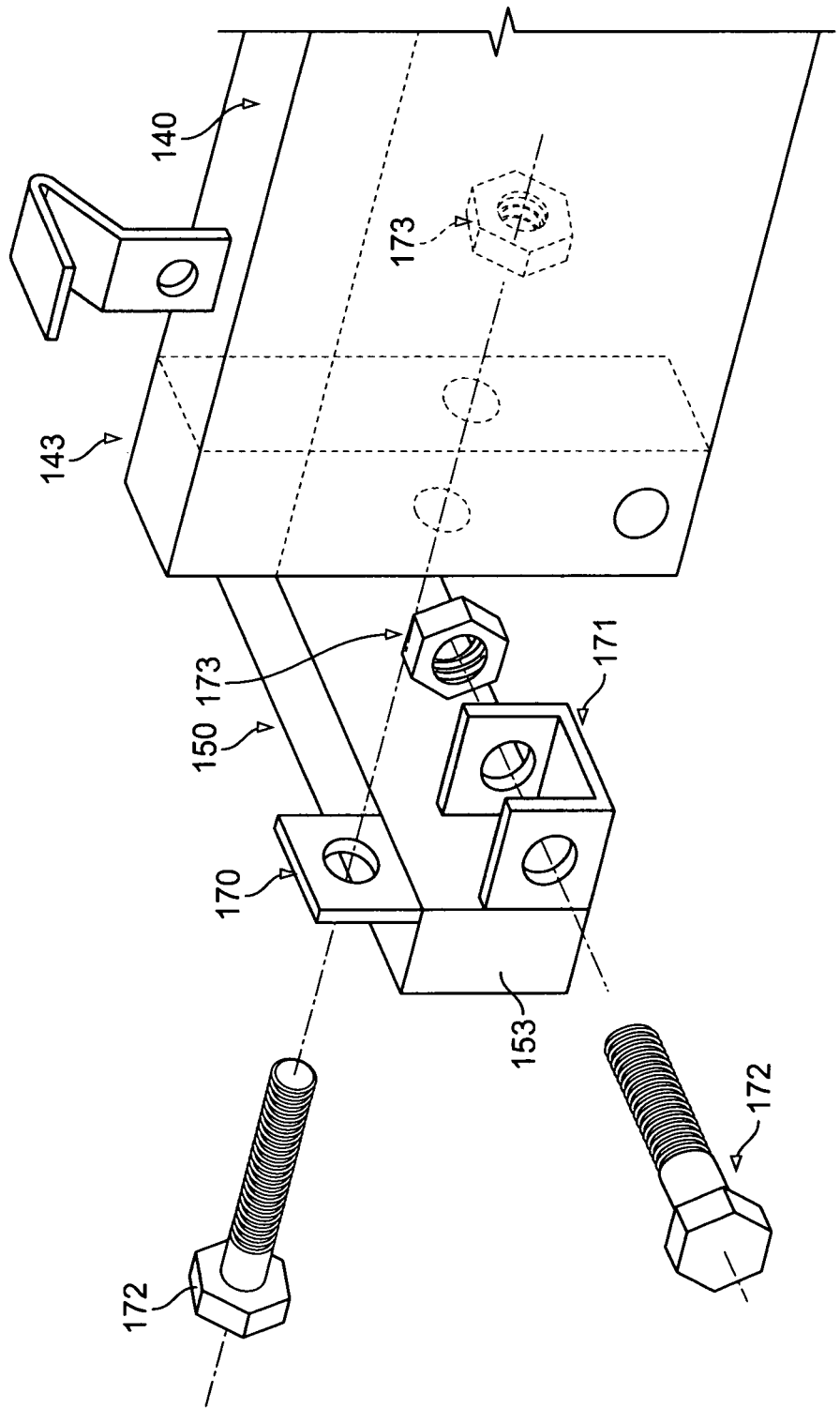
Figure 18:
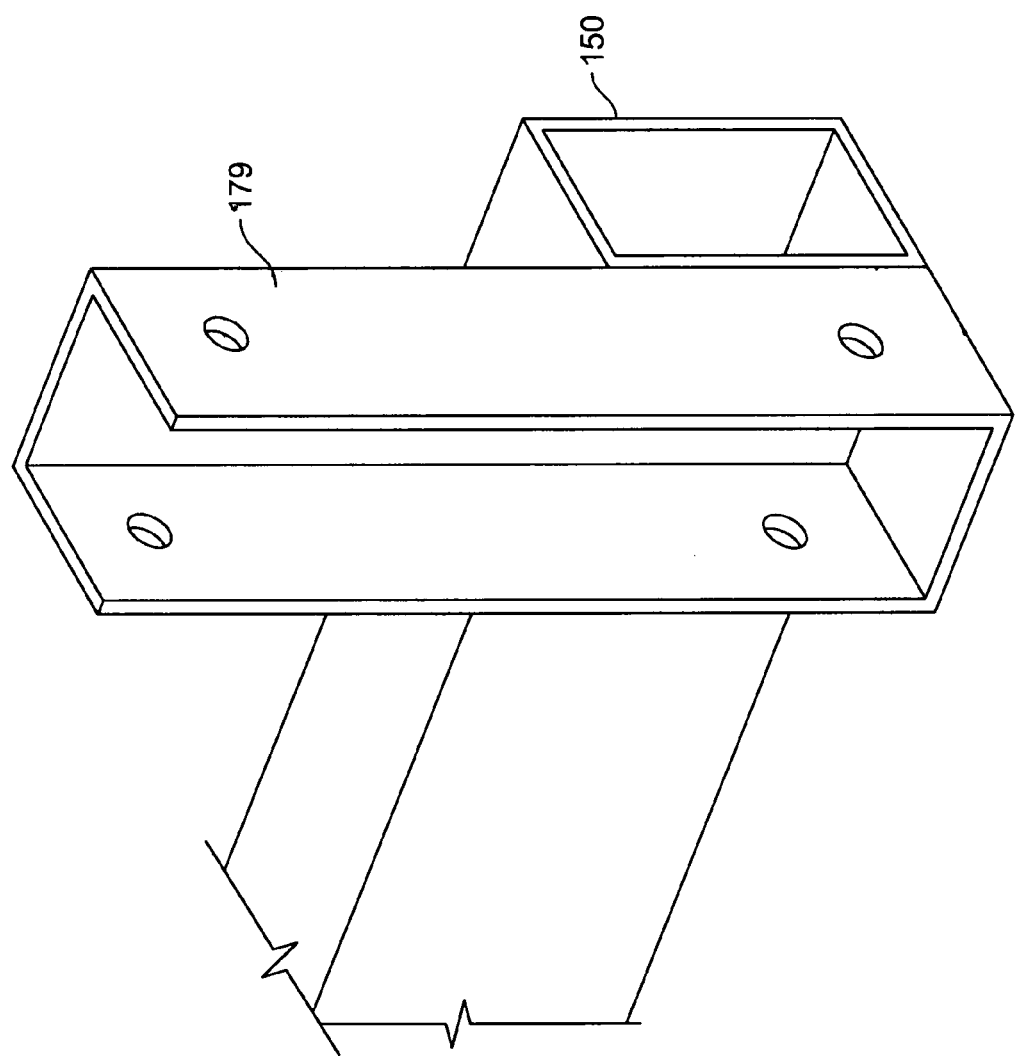
FIG. 18 shows an alternative attachment of the tension arm to the side beam.

With reference to FIGS. 5 and 18, the beams may be attached together by a number of conventional means selected appropriately to work with the particular beam types and materials. In the embodiment shown, the first end 143 of the first side beam 140 is placed into a u-shaped bracket 171 with holes is attached to the first end 153 of the end beam structure or region; in this case, to the tension arm extension 127. A flat brace 170 with a hole extends upward from the tension arm. The ends of the side beams 143, 153 are then bolted together using a conventional nut 173 and bolt 172 arrangement. Alternatively, as shown in FIG. 18, a u-shaped channel 179 welded or otherwise attached to the end beams 150 that extends above the end beam 150 and includes a bottom support and a side fastening design can be used in place of the bracket and brace arrangement. This design may be especially appropriate for open section or other beams where a longitudinal fastener could not be used.

Figure 3:
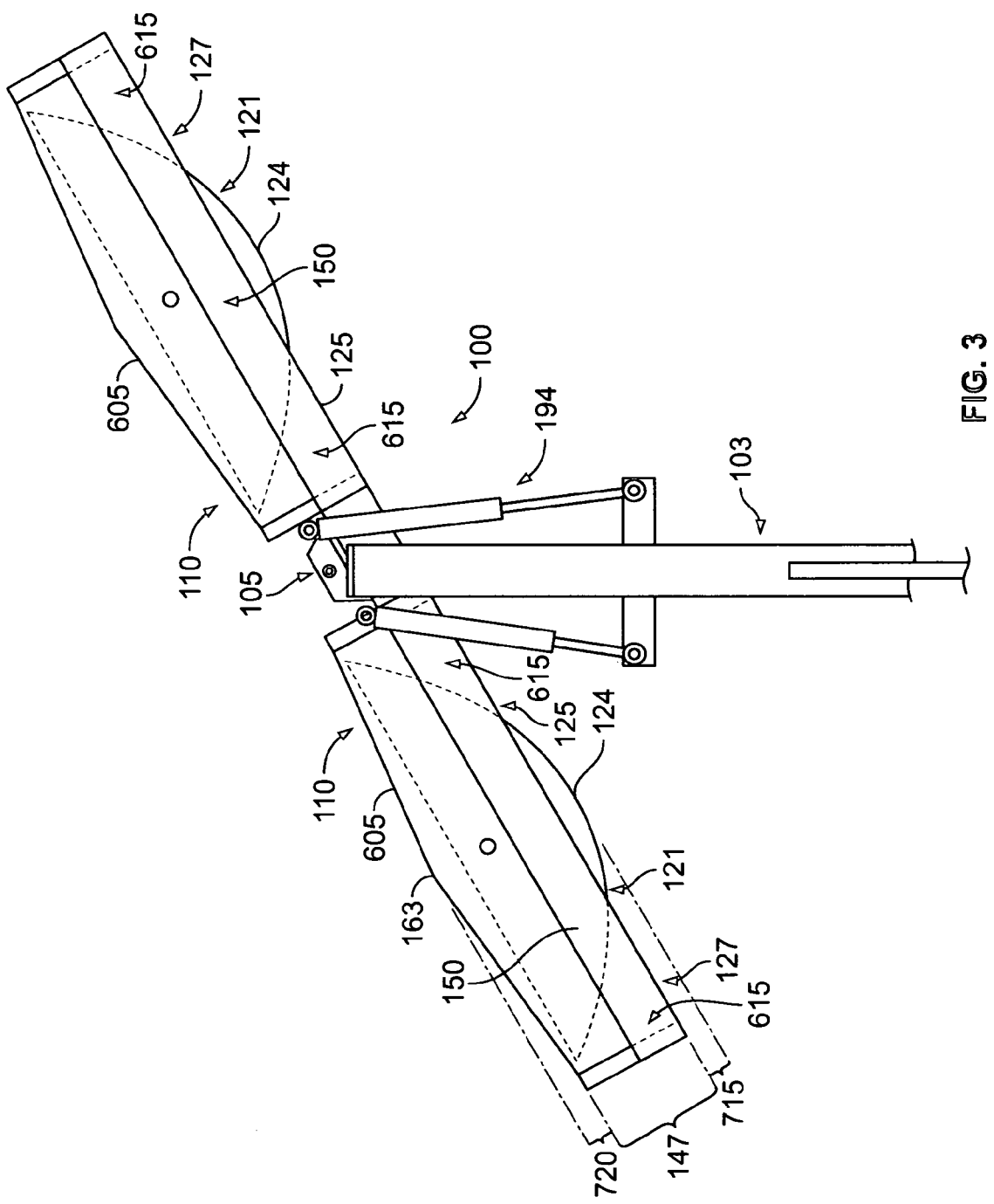

FIG. 3 illustrates the use of hydraulic dampers 194 to limit the sudden twisting or torsional forces on the frame that can be caused by wind gusts. They also help control the magnitude of longitudinal oscillations and harmonic vibrations which could compromise the integrity of the system.

Figure 6:
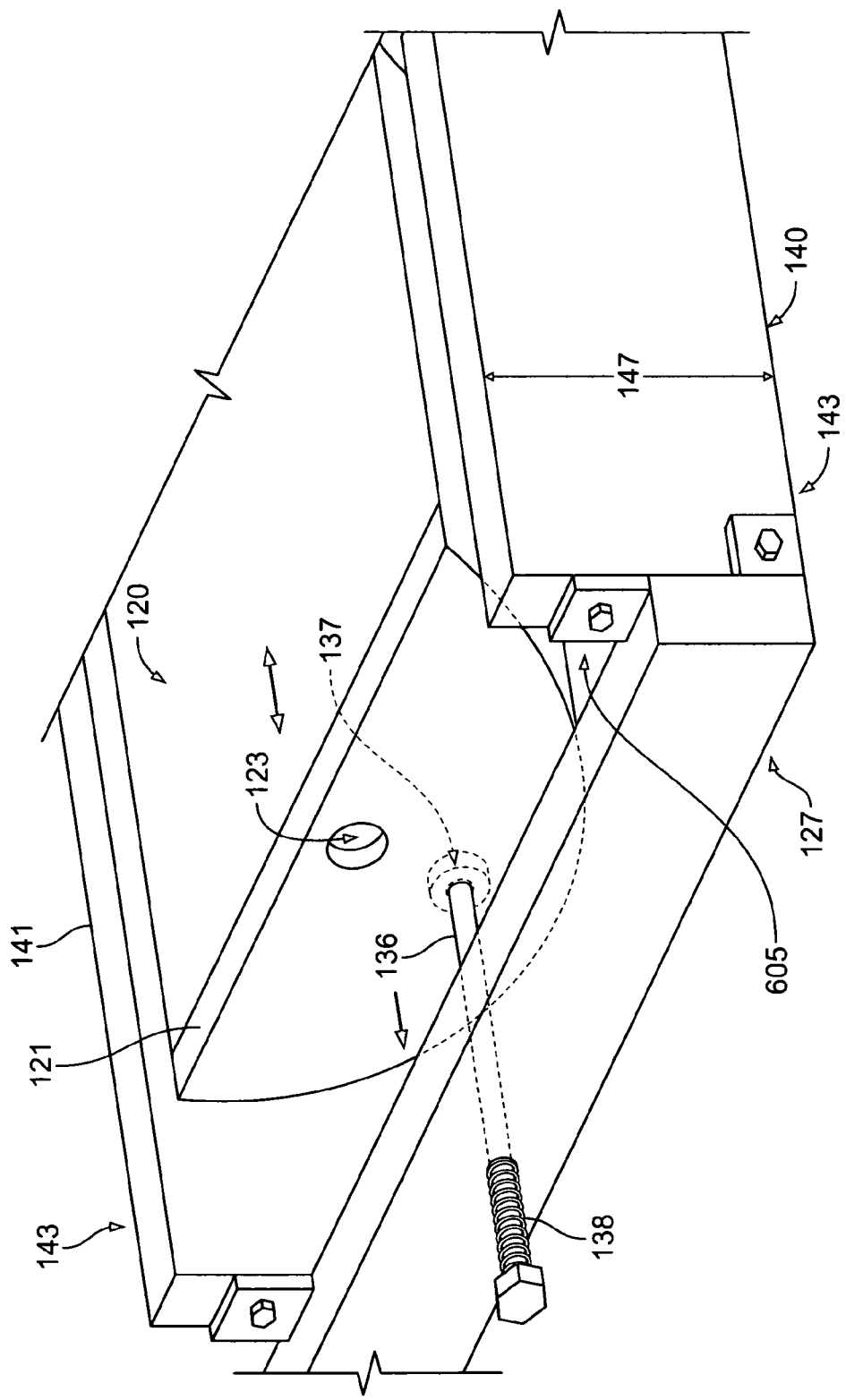

With additional reference to FIG. 6, the collector 100 includes a reflective membrane 120 which is strapped or otherwise attached to two end forms 121. Various means of attaching the membrane 120 to the end forms 121 are possible, although a strap is often used.

The end forms 121 must be held apart so as to place the thin-film reflector membrane 120 under tension. Therefore, the end forms 121 are attached to the end beam portion of the frame 110 which, in the embodiment shown, is integral with the tension arm assembly extension 127.

Preferably, the attachment means is a large threaded rod 136. A nut 137 compresses a die spring 138 that is positioned between the tension arm extension 127 or end beam and the end form 121, placing tension on the reflective membrane 120. The nut 137 on the threaded rod 136 may be tightened, pulling the end-forms 121 away from each other and stretching the membrane 120 into the correct shape. The compressed die spring 138, or other biasing means, maintains uniform tension on the membrane as it expands and contracts with changes in ambient temperature This tightening also pulls on the tension arms extensions 127 and places the side-beams 140, 141 in compression.

When in use, the apex 124 of the end forms 121 is usually positioned to extend downward through the frame 110, toward the ground when the frame 110 is in a horizontal position. The reflective surface of the membrane 120 is positioned to face upward, allowing concentration of sunlight at the desired linear region.

Figure 7:
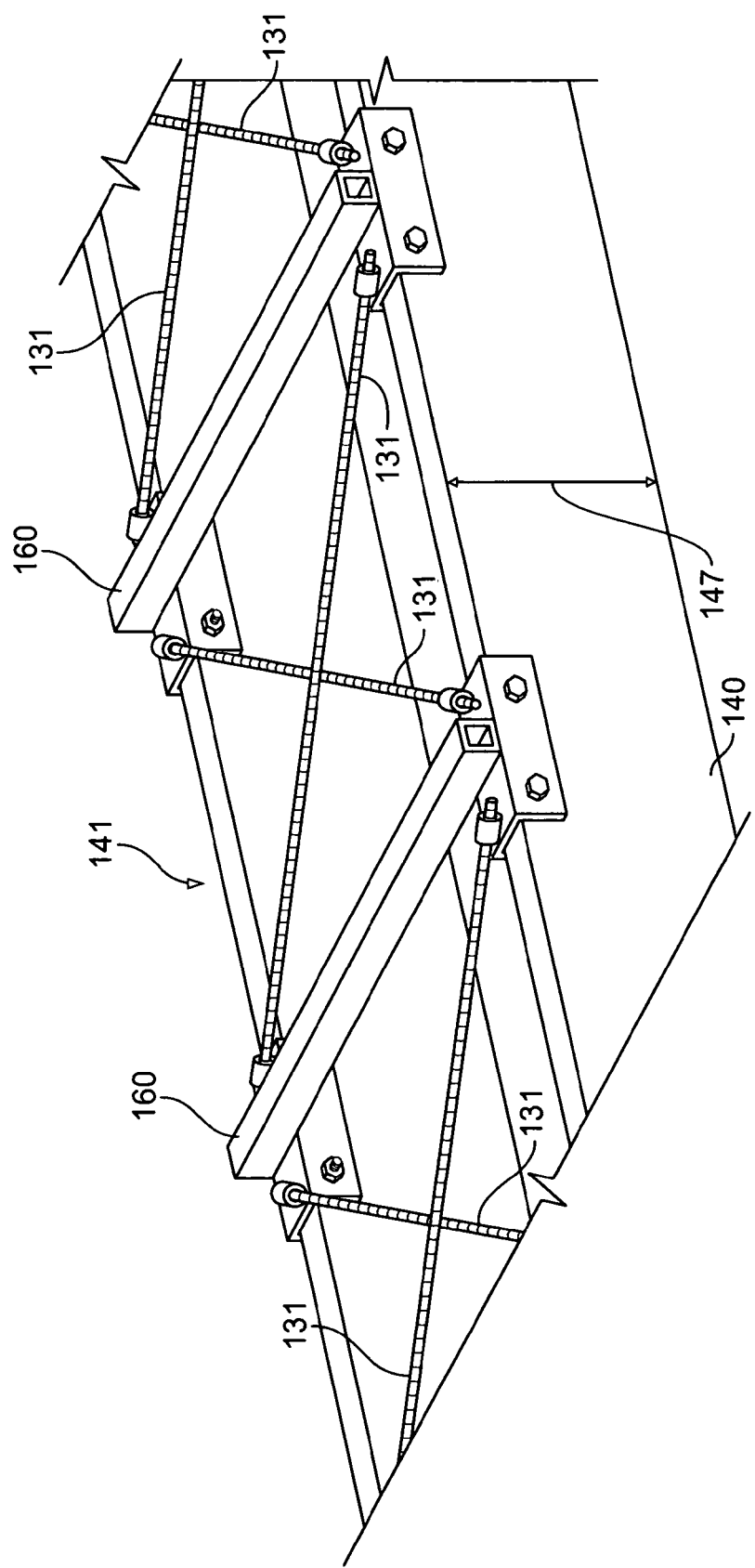

With reference to FIGS. 1, 2, 7, 8 and 9 ridge caps 160 are placed at intervals between the end beams 150, 151 near the top of the frame 110. End ridge caps 180 are placed near the ends of the side beams. Preferably, the ridge caps 160 and end ridge caps 180 each have a substantially isosceles triangular cross-section, with the apex 163 positioned to lie toward the top of the frame 110, and including first and second base vertices 161, 162; however, as shown in FIG. 7, a flat profile beam member may be used instead. The end ridge caps 180 are usually solid, while the ridge caps 160 may have an open construction to reduce weight and allow maximum sunlight to strike the membrane.

The first base vertex 161, 181 of each ridge cap 160 and end ridge cap 180 is attached to the first side beam 140 and the second base vertex 162, 182 of each ridge cap 160 and end ridge cap 180 is attached to the second side beam 141. Preferably, the distance between the ridge caps are equal in length. In the device as shown, in which the side beams are substantially straight and parallel, preferably the ridge caps 160 and end ridge caps 180 are perpendicular to the side beams 140, 141 at the points of connection.

Figure 9:
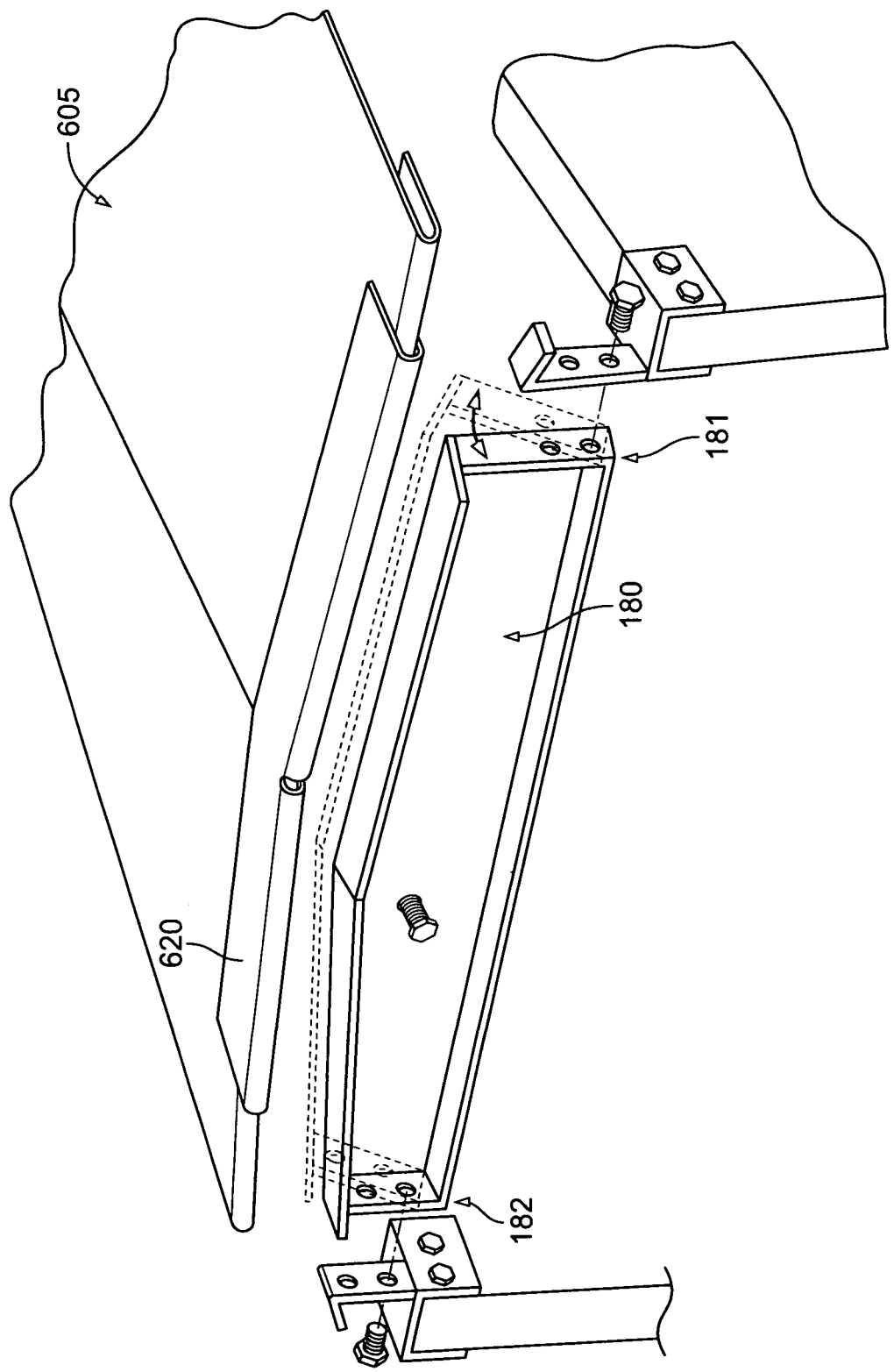

With reference to FIG. 9, the end ridge caps 180 may be attached to the side beams 140, 141 with a connection that allows them to pivot inward with the removal of a minimal number of bolts or other connectors. This structural feature allows for easier removal of the cover 605 and adjustments or changes to the membrane 120 without the need to disassemble or replace significant portions of the device.

Tensioned cables 131 or other supporting structural elements, for example adjustable threaded rods, are attached diagonally across the top of the frame 110. Preferably each cable 131 is tensioned to a specific torque so that it does not stretch as the collector 100 is rotated, but a single cable could be employed. The tensioned cables 131 are attached diagonally between pairs of ridge caps 160 and/or the end ridge caps 180, running from near the first base vertex of one ridge cap to near the second base vertex of the other ridge cap.

Figure 8:
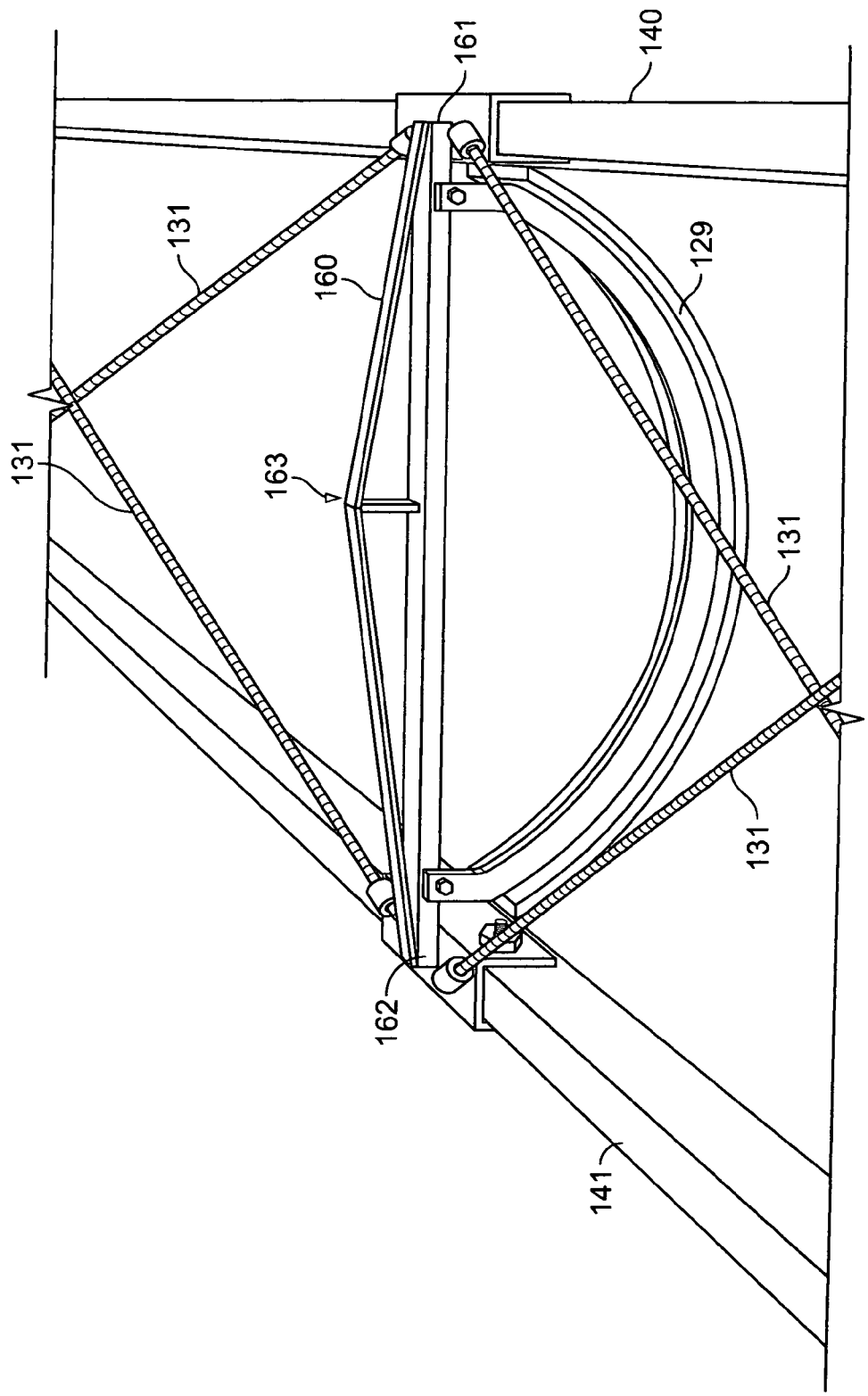

With reference to FIGS. 1 and 8, the device may include one or more shaping forms 129 or ribs placed along the membrane 120 at intervals to maintain the desired shape along the full length. The shaping forms 129 are preferably placed under and connected to the ridge caps 160. This allows the shaping forms 129 to be held in place on the side beams 140, 141 by the ridge cap 160 connections which saves making an extra connection during the manufacturing process.

A collector pipe 133, which may be used to heat water, is supported by collector supports 134 to lie along the linear region where the sunlight is concentrated by the reflective surface of the membrane 120. The collector pipe exits the reflector through the access hole 123 in the end form 121. Generally, the collector supports 134 would be supported by the ridgecaps 160, but can also be attached to or integral with the shaping forms 129. The collector pipe 133 is also be supported by the end forms 150, 151, tension arms 125, or other structures in the device. Although this embodiment shows a collector pipe, persons of ordinary skill in the art will understand that other means of collecting the concentrated solar energy might be used.

Figure 10:
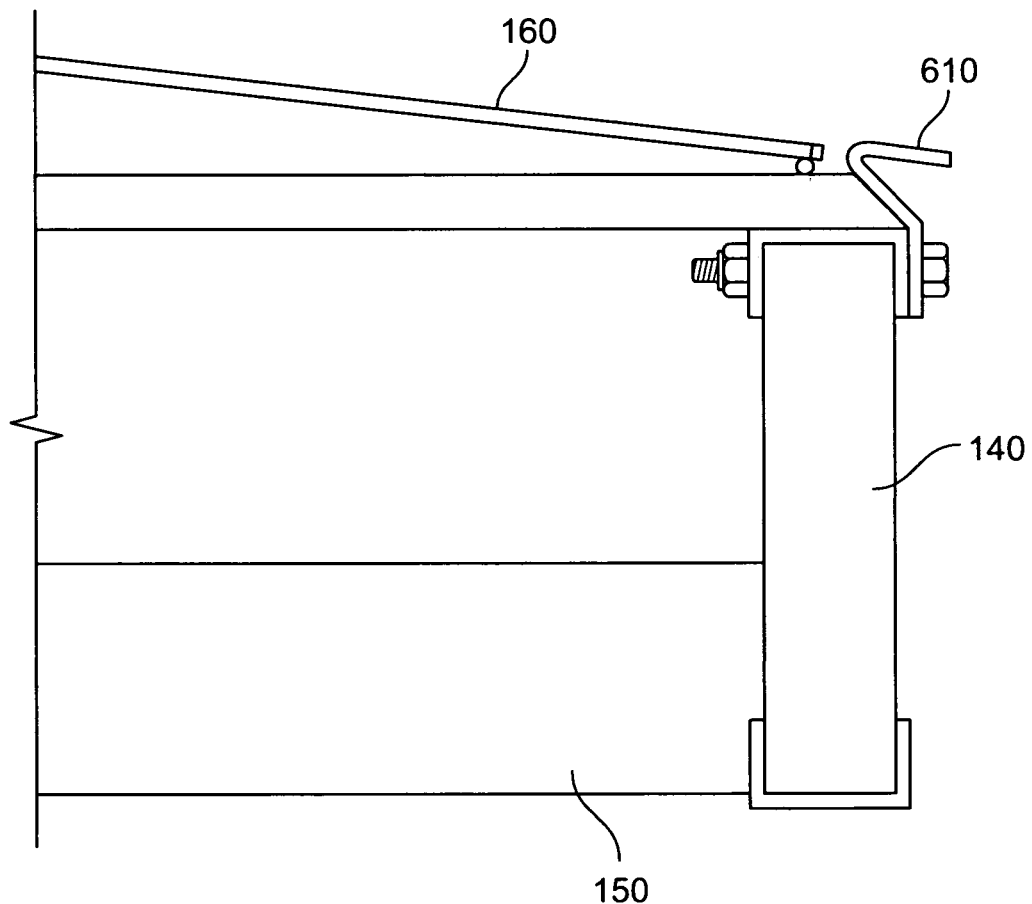

With reference to FIGS. 9 and 10 the top of each collector 100 may include a flexible, transparent cover 605. The cover 605 is supported by the ridge caps 160, a ridge pole or poles 132, and sealing strips 610. It will be noted that other cover types could be used, including a curved, rigid cover; however, in general, flexible covers are preferred because of superior translucency. The cover 605 may be hooked onto the end ridge forms 180 using a clip 620.

The ridge pole 132, supported by the ridge caps 160, runs between the peaks of the ridge caps and is positioned to lie parallel to the line running between the apexes 163 of adjacent ridge caps. The ridge pole or poles 132 also attach to the end ridge caps 180. Sealing strips 610 can run along the tops of the two side beams 140, 141 between the ridge caps 160 and hold the cover 605 against the side beams 140, 141 with either an adhesive or mechanical attachment.

As the collectors 100 are rotated from the horizontal when in use, usually in a range to a maximum of plus or minus 70 degrees, the combination of the curved flexible reflective membrane 120 and cover 620 ensure that a convex surface is always directed toward the wind. The convex membrane 120 and cover 605 diffuse the wind forces on the reflector.

Further, unlike other reflector devices which must be turned upside down in the "stow" position when the wind speed becomes excessive, usually on the order of 35 mph or higher, the current device can simply be turned by its control system to the horizontal position with the reflective membrane remaining upwards.

With reference to FIGS. 3 and 11, to further aid in reducing effect of wind, particularly high wind, on the device, the side beams 140, 141 hang down from the edges of the curved reflector, forming a small concave region 615 that causes turbulent airflow and greatly reduces the wind forces acting directly on the collector 100. Significantly, the side beams 140, 141 have a width 147 that is on the order of 66% of the distance from the apex 163 of the ridge caps to the apex of the shaping forms 129. Generally, good results will be obtained when such width 147 is at least 50% of the apex to apex distance although the construction will likely provide some amelioration of wind forces even with a smaller width.

The side-beams 140, 141 will diffuse the wind off of the collector 100 as shown in FIG. 11. In the design shown, the cover's rise 720 above the side beams is approximately equal to the distance 715 that the reflector 120 bottom extends below the side beam, but the primary requirement is a substantially convex shape for both the reflector and the cover to produce similar drag for both structures. Drag will also be affected by the materials and exact shapes used. Generally a low overall horizontal profile is desirable. Unlike traditional uncovered troughs that effectively create a wind foil, with the current device there will be similar wind speeds on the top and bottom surfaces of the reflector 100, creating little or no pressure differential. Consequently, very little lift or downforce is created when the wind blows against the reflector 100. This fact makes the current device particularly well-suited to roof-top installations where such forces could compromise not only the reflector but the building structure.

Figure 12B:
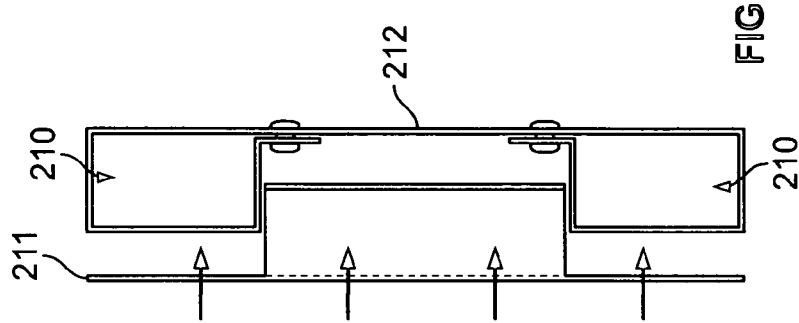
FIG. 12B shows a cut-away end view of the light-weight beam construction employing closed sections.
Figure 12A:
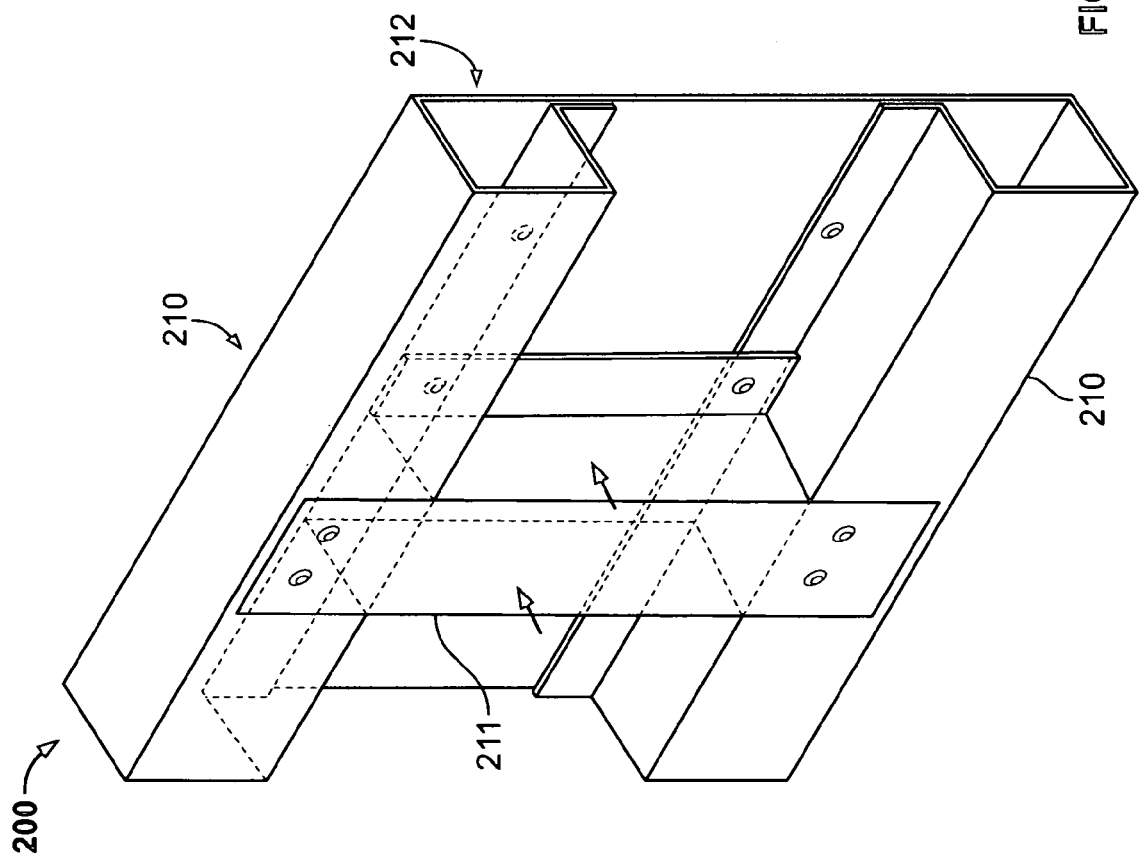

Critical components in the construction of a frame that is capable of more effectively spanning a longer distance than the prior art devices are the light-weight side beams. These side beams must not only be relatively light-weight, but must also have appropriate resistance to torsional forces. One method for effecting a side beam that can span long distances is shown in FIGS. 12A and 12B. The side beam 200 consists of multiple dosed sections 210. Rectangular closed sections 210 of thin metal act as beams that span the length of the side beam on the top and bottom. Smaller rectangular sections 211 of thin metal are used as vertical supports between the top and bottom beams. Metal cladding 212 can be added to either or both of the inside and outside of the beam. The cladding and vertical supports may be added either with hardware, such as rivets, screws, bolts, or the like, welding, or with some type of adhesive, such as epoxy. The cladding may be added along the entire length of the beams to increase the torsional rigidity. However, the amount of cladding may be reduced to lower the weight or cost. One reasonable compromise is to clad one side (e.g. the outer side) along the entire length and clad a small region around the vertical supports on the other side (e.g. the inner side).

Figure 13:
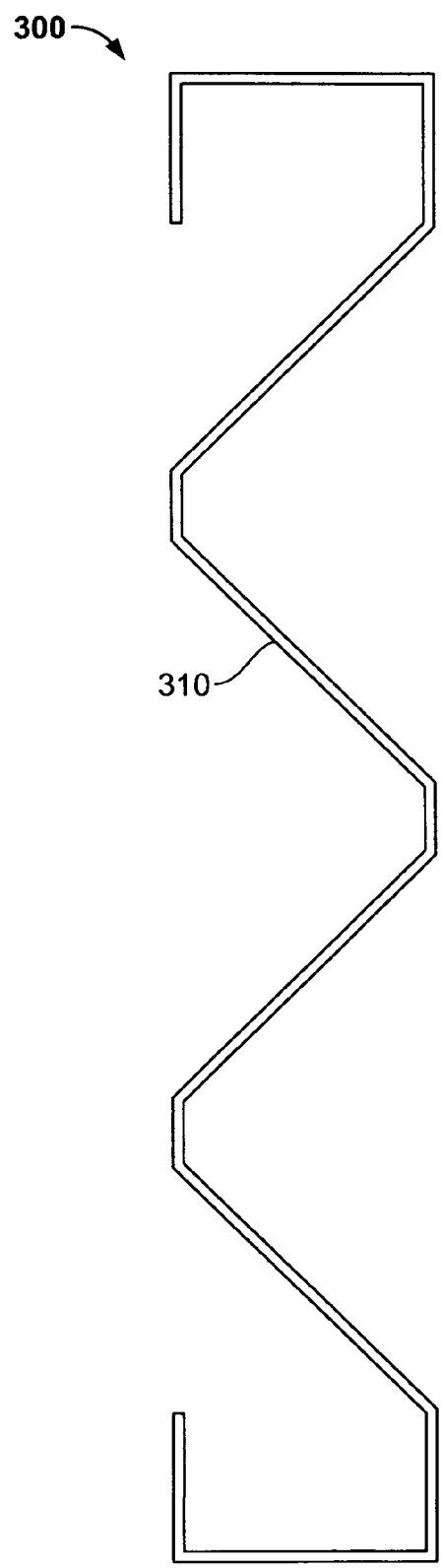
FIG. 13 shows a sigma-shaped light-weight beam construction.

Another side-beam construction that can span long distances is shown in FIG. 13. The beam 300 includes an open, sigma-shaped section of formed sheet metal 310, such as sheet metal formed with a press break or with a roll-forming process. The strength of the open section may be reinforced along its length by attaching stronger materials or shapes, either inside or outside of the sigma section, or by applying cladding to all or parts of the open section to form a closed section. One means of reinforcement would be to add a steel tube or channel in the sigma section or alternatively use a steel core. Other materials, such as molded foam, could be inserted into the sigma section 310 before cladding.

Figure 15:
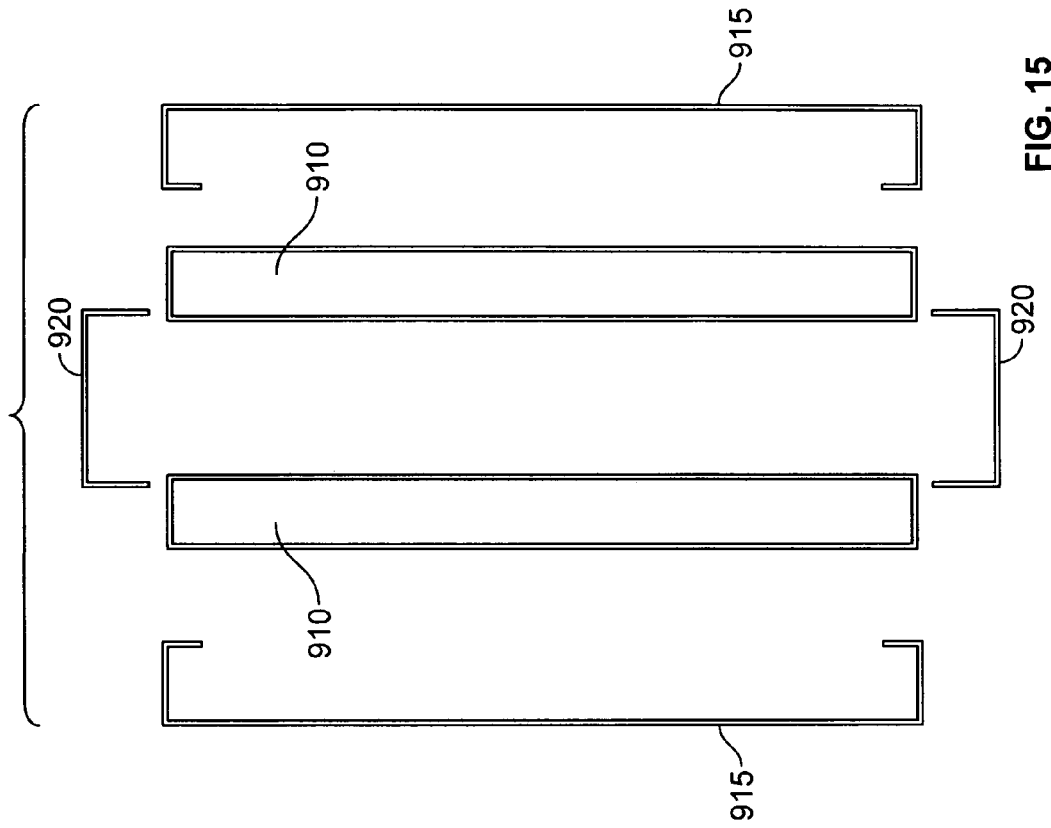
FIG. 15 shows an exploded view of the third alternative beam construction.
Figure 14:
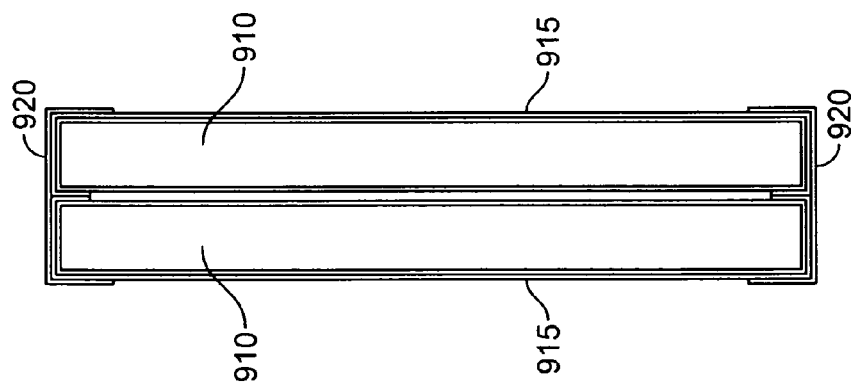
FIG. 14 shows a third alternative beam construction.

FIGS. 14 and 15 show yet another possible side beam construction. Including two studs 910, with an outer metal covering 915, held in place with top and bottom channel members 920 could also be used. The components of the beam could be held together using glue, bolts, welding or other means.

Figure 16:
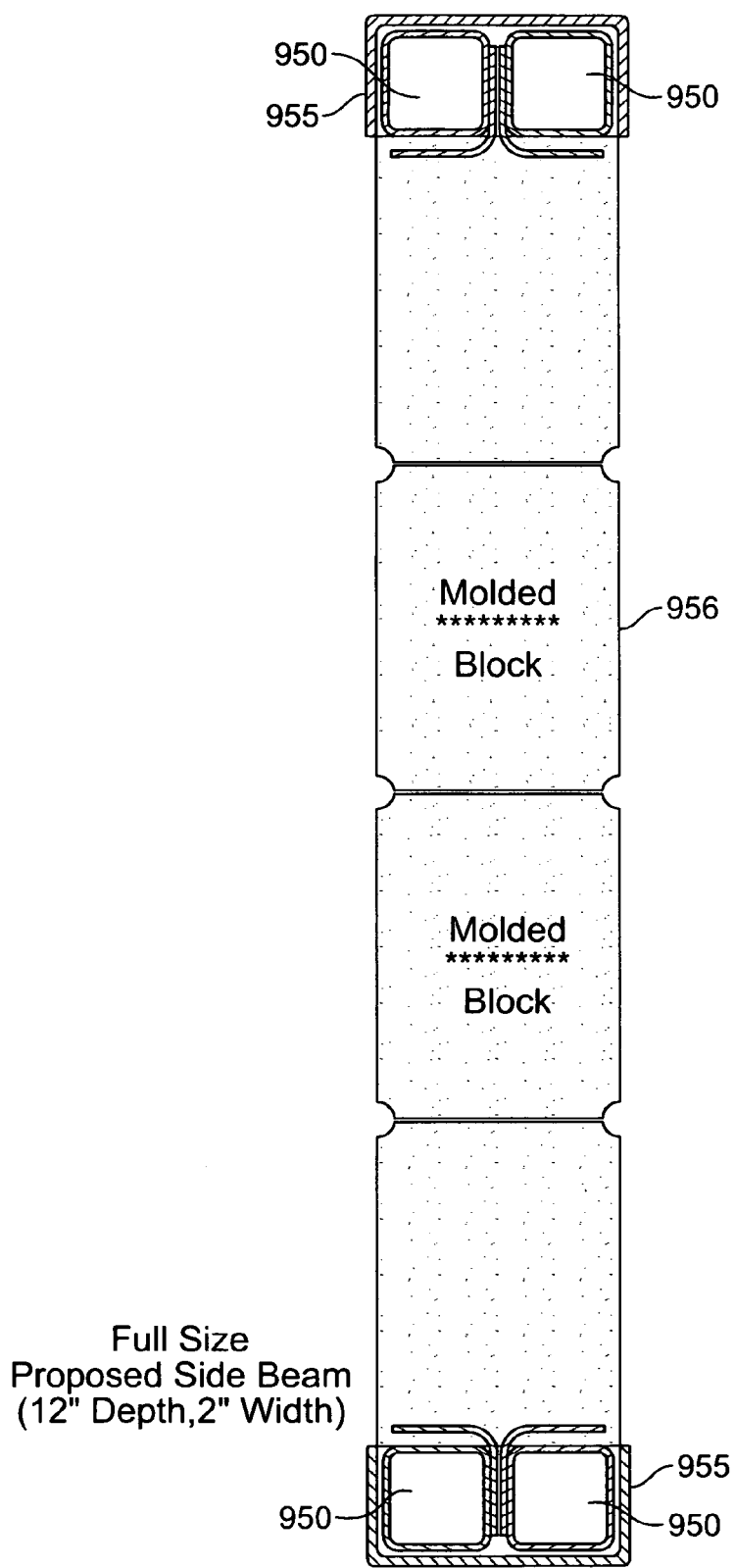
FIG. 16 shows a beam utilizing molded foam.

FIG. 16 shows another alternative beam which includes two square tubes 950 on the top and bottom of the beam held together by channel members 955, with molded form 956 forming the interior portion of the beam.

It is desirable to be able to adjust the length of the collector 100 for particular installations. In order to customize the length of the collectors, the side beam length is adjusted; the length of the thin-film reflector is adjusted (these films are typically cut to length during assembly); the spacing of the ribs and ridge caps is adjusted; and the lengths of the cables are adjusted. Beams can also be spliced together 190 using appropriate connective hardware.

One method of modifying the length of the side beams is to simply do a customized manufacturing of the beam to the desired length, while appropriately adjusting the length and spacing of the vertical supports in the closed form side beams. For an open section beam, such as the sigma beam, formed on a press break, another manufacturing option is to cut the material to length, punch the holes at the appropriate locations, and form the sigma section shape at the end of the process. For an open section formed on a roll form process, first the holes are punched, and then the metal is formed into shape and finally cut at the appropriate lengths at the end.

Figure 17:
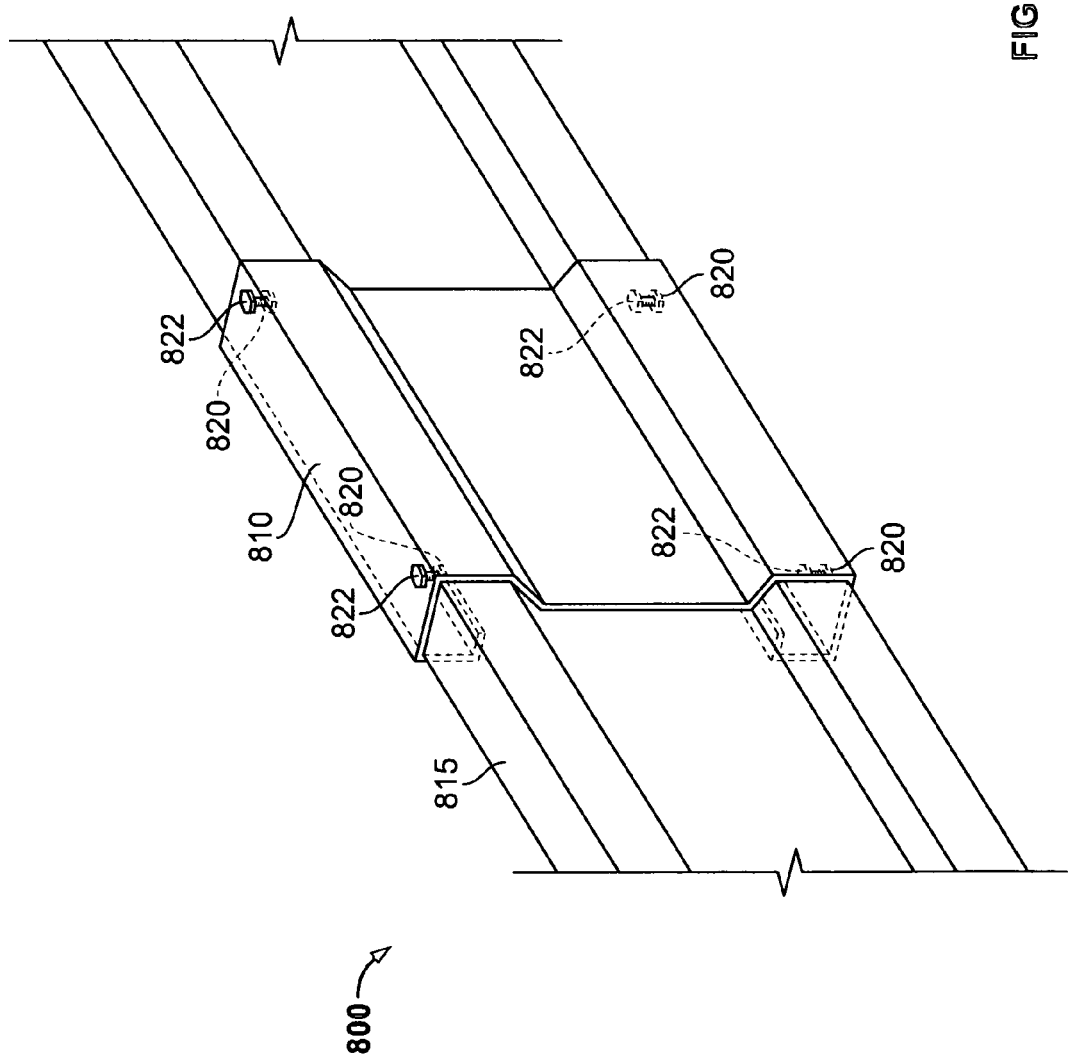
FIG. 17 shows a telescoping beam construction that allows adjustment in the beam length.

However, it may be desirable to have the ability to adjust the length of the side beams. One option is to create a beam 800 including telescoping section(s). One portion of a telescoping beam 800 is shown in FIG. 17, but generally two standard open sections 810 would be positioned at each end of the side beam 800 and a third section 815 fits within the other two sections 810. Holes 820 and connectors 822, such as bolts, may be placed at certain distances in the side beam 810 and third section 815 to cover incremental lengths. Alternatively, the holes may be in the form of overlapping channels to allow for completely configurable lengths. Multiple (e.g. two or more) telescoping sections may be used to allow for many different lengths.

While the present invention has been shown and described with reference to the foregoing preferred embodiments, it will be apparent to those skilled in the art that changes in form, connection, and detail may be made therein without departing from the spirit and scope of the invention as defined in the appended claims.

We claim:

1. A solar reflector comprising:
   A reflective membrane defining a first end and a second end, wherein the first end is attached to a first end form and the second end is attached to a second end form, and wherein each of the first and second end forms are adapted to hold the membrane in a desired shape;
   A frame comprising
      a first side beam region defining a first end and a second end,
      a second side beam region defining a first end and a second end,
      a first end beam region connecting the first end of the first side beam region and the first end of the second side beam region; and
      a second end beam region connecting the second end of the first side beam region and the second end of the second side beam region; and
      wherein the first end form is attached to the first end beam region, and the second end form is attached to the second end beam region;
   A support structure for supporting the frame;
   A first ridge cap connected between the first side beam region and the second side beam region;
   A second ridge cap connected between the first side beam region and the second side beam region; wherein the first ridge cap is positioned near the first end beam region and the second ridge cap is positioned at a selected distance from the first end beam region;
   A first tensioned member defining a first end and a second end, wherein the first end of the first tensioned member is attached to the first ridge cap adjacent to the first side beam region, and the second end of the first tensioned member is attached to the second ridge cap adjacent to the second side beam region; and a second tensioned member defining a first end and a second end, wherein the first end of the second tensioned member is attached to the first ridge cap adjacent to the second side beam region, and the second end of the second tensioned member is attached to the second ridge cap adjacent to the first side beam region.

2. The solar reflector of claim 1 wherein the first ridge cap and the second ridge cap are each substantially isosceles triangular defining an apex and the apex is positioned to point away from the reflective membrane.

3. The solar reflector of claim 2 further comprising a ridge pole wherein the ridge pole is positioned to lie near the apex of the first ridge cap and the apex of the second ridge cap.

4. The solar reflector of claim 3 further comprising a flexible transparent cover wherein the cover is attached to the first and second side beam regions and is supported by the first ridge cap and the ridge pole.

5. The solar reflector of claim 4 wherein the first and second end forms define a height and each of the first and second beam regions define a width, and wherein the ridge cap defines a height, and wherein the width of the side beam regions is approximately equal to at least fifty percent of the combined heights of the end forms and the cover.

6. The solar reflector of claim 5 wherein the width of the side beam regions is approximately equal to at least sixty percent of the combined heights of the end forms and the cover.

7. The solar reflector of claim 1 wherein the first and second tensioned members are cables.

8. The solar reflector of claim 1 wherein the support structure comprises a first tension arm attached to the first end of the first side beam region and the first end of the second side beam region and a second tension arm attached to the second end of the first side beam region and the second end of the second side beam region.

9. The solar reflector of claim 8 wherein the first end beam region and the first tension arm are of unitary construction and the second end beam region and the second tension arm of unitary construction.

10. The solar reflector of claim 1 wherein the first ridge cap is pivotally attached to the first side beam region and to the second side beam region.

11. The solar reflector of claim 1 wherein the first side beam region and the second side beam region each comprise at least two longitudinal members comprising hollow metal sections and a plurality of support members attached to the at least two longitudinal members, and wherein the at least two longitudinal members are cladded.

12. The solar reflector of claim 1 wherein the first side beam region and the second side beam region each comprise a means for selectably adjusting the length of the beam region.

13. The solar reflector of claim 1 further comprising hydraulic dampers in operable connection with the frame to reducing torsional forces on the frame.

14. The solar reflector of claim 1 further comprising an optically translucent convex cover.

\* \* \* \* \*